United States Patent
Chandra et al.

(10) Patent No.: US 11,477,890 B2
(45) Date of Patent: Oct. 18, 2022

(54) PLATED PADS AND LEADS FOR SURFACE MOUNT TECHNOLOGY CONNECTIONS

(71) Applicant: DELL PRODUCTS L.P., Round Rock, TX (US)

(72) Inventors: Umesh Chandra, Santa Cruz, CA (US); Bhyrav Mutnury, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 168 days.

(21) Appl. No.: 16/882,427

(22) Filed: May 22, 2020

(65) Prior Publication Data

US 2021/0368623 A1    Nov. 25, 2021

(51) Int. Cl.
  *H05K 1/18*    (2006.01)
  *H05K 1/11*    (2006.01)

(52) U.S. Cl.
  CPC .............. *H05K 1/181* (2013.01); *H05K 1/111* (2013.01)

(58) Field of Classification Search
  CPC ...................................................... H05K 1/181
  USPC ........................................................... 361/760
  See application file for complete search history.

(56) References Cited

U.S. PATENT DOCUMENTS

| | | | | |
|---|---|---|---|---|
| 5,200,364 | A * | 4/1993 | Loh | H01L 24/06 257/676 |
| 2016/0179733 | A1* | 6/2016 | Huang | G06F 13/4282 710/308 |
| 2017/0317457 | A1* | 11/2017 | Baker | H01R 25/162 |
| 2018/0368259 | A1* | 12/2018 | Kumar | H01R 12/72 |
| 2019/0320529 | A1* | 10/2019 | Goud | H05K 1/111 |
| 2020/0314998 | A1* | 10/2020 | Yong | H05K 1/09 |
| 2021/0378094 | A1* | 12/2021 | Chandra | H05K 1/111 |
| 2022/0110207 | A1* | 4/2022 | Chandra | H05K 1/116 |

* cited by examiner

*Primary Examiner* — Stanley Tso
(74) *Attorney, Agent, or Firm* — North Weber & Baugh LLP

(57) ABSTRACT

A high-speed transmission circuit comprises a connector pin that serves as part of a signal path, has a first conductivity, and has a connector pin leg that is coupled to a pad that has a second conductivity lower than the first conductivity. The connector pin leg and at least a portion of the pad form a resonant sub-circuit coupled to the signal path. The second conductivity causes a reduction in insertion loss in the signal path by damping a current in the resonant sub-circuit.

20 Claims, 5 Drawing Sheets

500

```
┌─────────────────────────────────────────────┐
│ APPLY A VOLTAGE TO A SIGNAL PATH THAT       │
│ COMPRISES A CONNECTOR PIN HAVING A FIRST    │
│ CONDUCTIVITY AND A CONNECTOR PIN LEG THAT   │
│ IS COUPLED TO A PAD HAVING A SECOND         │─── 505
│ CONDUCTIVITY LOWER THAN THE FIRST           │
│ CONDUCTIVITY, THE CONNECTOR PIN LEG AND AT  │
│ LEAST A PORTION OF THE PAD FORMING A        │
│ RESONANT SUB-CIRCUIT                        │
└─────────────────────────────────────────────┘
                     │
                     ▼
┌─────────────────────────────────────────────┐
│ IN RESPONSE TO A CURRENT BEING DRIVEN       │
│ THROUGH THE CONNECTOR PIN, THE SECOND       │
│ CONDUCTIVITY CAUSES A REDUCTION IN          │─── 510
│ INSERTION LOSS IN THE SIGNAL PATH BY        │
│ DAMPING A CURRENT IN THE RESONANT           │
│ SUB-CIRCUIT                                 │
└─────────────────────────────────────────────┘
```

FIG. 5

PLATED PADS AND LEADS FOR SURFACE MOUNT TECHNOLOGY CONNECTIONS

BACKGROUND

The present disclosure relates generally to surface mount technology (SMT) connections such as SMT connectors and cables. More particularly, the present disclosure relates to improving signal integrity in high-speed circuits using such SMT connections.

Many high-speed connectors take advantage of the form factor of SMT connectors, which are known to improve signal integrity when compared with other, bulkier designs. SMT cables are also becoming increasingly popular as they avoid the need for connectors altogether. Despite their advantages, both SMT connectors and SMT cables have a number of drawbacks. For example, depending on the direction signal traces break out from SMT components on a board, pads or lead frames of the SMT connector or cable may leave exposed an unused conductive region on the board that oftentimes causes undesired parasitic effects that greatly degrade signal quality and wipe out much of the gains archived by using SMT connections in the first place. Accordingly, it is highly desirable to find new ways to mitigate or eliminate such undesired effects without degrading signal integrity.

BRIEF DESCRIPTION OF THE DRAWINGS

References will be made to embodiments of the disclosure, examples of which may be illustrated in the accompanying figures. These figures are intended to be illustrative, not limiting. Although the accompanying disclosure is generally described in the context of these embodiments, it should be understood that it is not intended to limit the scope of the disclosure to these particular embodiments. Items in the figures may not be to scale.

FIG. 5 is a flowchart illustrating a process for improving signal integrity, according to embodiments of the present disclosure.

DETAILED DESCRIPTION OF THE PREFERRED EMBODIMENTS

Figure 1:
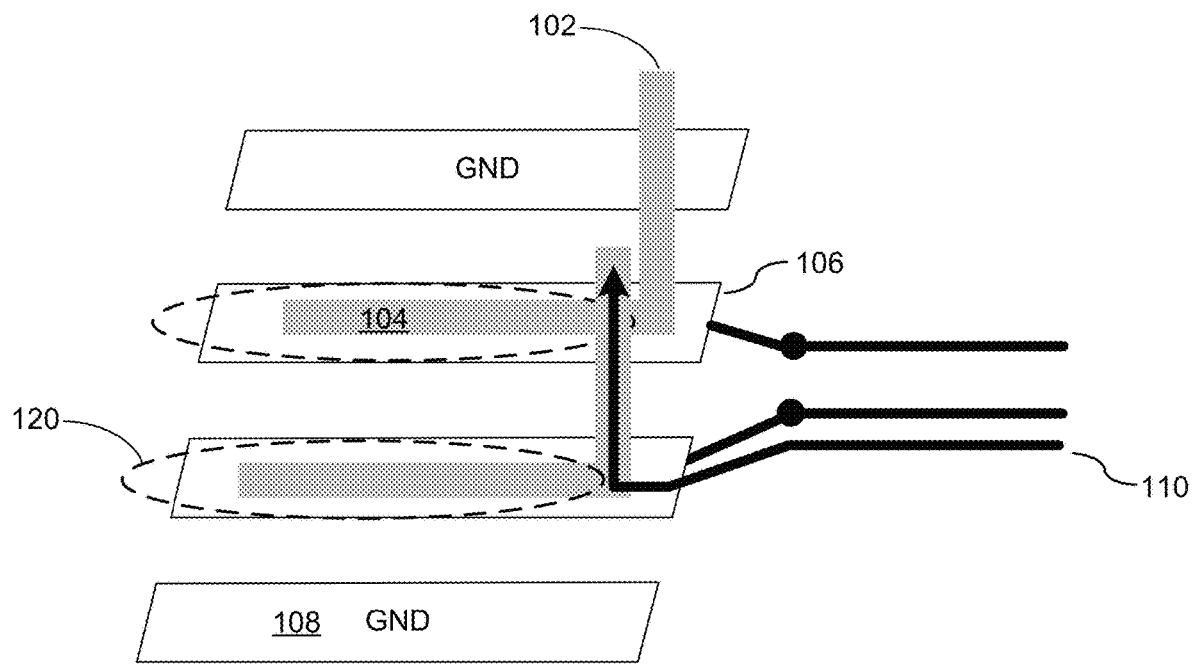
FIG. 1 is a simplified layout of a common SMT connection for a printed circuit board (PCB).

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system/device, or a method on a tangible computer-readable medium.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," "communicatively coupled," "interfacing," "interface," or any of their derivatives shall be understood to include direct connections, indirect connections through one or more intermediary devices, and wireless connections. It shall also be noted that any communication, such as a signal, response, reply, acknowledge, message, query, etc., may comprise the exchange of one or more messages.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items.

It shall be noted that any experiments and results provided herein are provided by way of illustration and were performed under specific conditions using a specific embodiment or embodiments; accordingly, neither these experiments nor their results shall be used to limit the scope of the disclosure of the current patent document.

It shall also be noted that although embodiments herein may be described within the context of SMT connectors, aspects of the present disclosure are not so limited. As a person of skill in the art will appreciate that the teachings described herein may improve signal integrity in other circuits—whether discrete or distributed—that exhibit similar or different transmission line effects. For example, non-microstrip designs that use coaxial stubs can be made "lossy" to benefit from the effects achieved by using the teachings described herein. Accordingly, the aspects of the present disclosure may be applied or adapted for use in many other contexts.

Ever-increasing demands on bandwidth and thus transmission speeds for digital signal processing require higher and higher operating frequencies, i.e., high-speed signals that have shorter and shorter wavelengths and signals with picosecond rise times. As is known in the art, once the geometrical dimensions of conductors and other conductive structures shrink to levels that are comparable to the electrical wavelengths of the signals transmitted by such conductors, this gives rise to transmission line effects. Oftentimes, these effects change the electrical transmission characteristics of a communication channel in a manner that result in unwanted signal distortion, increased insertion loss (single-ended or differential), and other non-linearities that adversely affect signal integrity. For example, once the length of a via—a plated through-hole representing a branch of a tee junction in a signal path—in an integrated circuit is at or about a quarter-wavelength of the high-frequency electrical signal in the signal path, the via behaves like an open circuit transmission line, even if the via itself has not been designed to carry any high-frequency signals.

To ameliorate transmission line effects of vias on signal integrity and improve insertion loss, common design considerations involve shielding of ground vias, choice of desired signal and ground via assignments, and mechanical back drilling that removes (i.e., drills out) conductive material (e.g., copper) from unused portions of the via, which may then be filled with a dielectric material, such as an electrically non-conductive epoxy. Such added, costly manufacturing steps introduce their own mechanical and electrical drawbacks, e.g., differing thermal expansion coefficients of the epoxy and the plated via, and the like.

FIG. 1 is a simplified layout of a common SMT connection for a PCB. SMT circuit 100 comprises a lead frame that consists of connector pin 102 and pin leg 104. Circuit 100 further comprises connector pad 106, ground strip 108, and a portion of signal path 110 that includes connector pin 102. As depicted in FIG. 1, pin leg 104 is bent in a direction opposite to signal path 110. Circuit components 102-108 are formed of electrically conductive material, e.g., copper that is mounted on a non-conductive PCB material, such as FR4 dielectric (not shown).

Manufacturing tolerances, wetting area for SMT components, alignment variations, and other considerations, such as ensuring that pin leg 104 is properly placed on the metal area of pad 106, usually require the dimensions of pad 106 on the PCB layout to extend beyond the dimension of connector pin 102 and pin leg 104. In addition, connector pin 102 is not always mounted at the same location on the PCB pad on different boards.

Both pin leg 104 and the area of connector pad 106, which extends to the left-hand-side of connector pin 102 in FIG. 1, are typically not considered part of signal path 110. In other words, pin leg 104 and most of connector pad 106 in FIG. 1 are "unused" portions 120 of SMT circuit 100. However, just like the vias previously mentioned, at high operating frequencies, e.g., in the GHz rage or in the presence of high-speed signals that, depending on data rates have relatively short rise times in the picosecond range, these unused portions 120 of SMT circuit 100 are subject to transmission line effects (also known by their misnomer "standing wave" effects) once their electrical length becomes comparable to their physical size. Unused portion 120 of SMT circuit 100 generates undesired resonances, antenna effects and, under certain circumstances, behaves like an open-ended transmission line, i.e., an unterminated resonant stub that acts a notch filter.

In practice, these effects (hereinafter "pad resonance") depend mainly on the length of the electrically conductive stub and, more generally, on geometry, i.e., electrical inductance and capacitance that are functions of geometry that determine the presence and locations of resonance frequencies associated with SMT circuit 100. As a rule of thumb, the greater the length or physical dimension of the unused portions are, i.e., the larger the coupling area, the greater the capacitive coupling to 110 signal path and the more adverse effects pad resonance has on crosstalk and, thus, signal integrity.

Accordingly, it would be desirable to have efficient cost-effective systems and methods in place that reduce unwanted transmission line effects in SMT connections and provide excellent electrical performance for next generation speeds without sacrificing mechanical stability.

Figure 2:
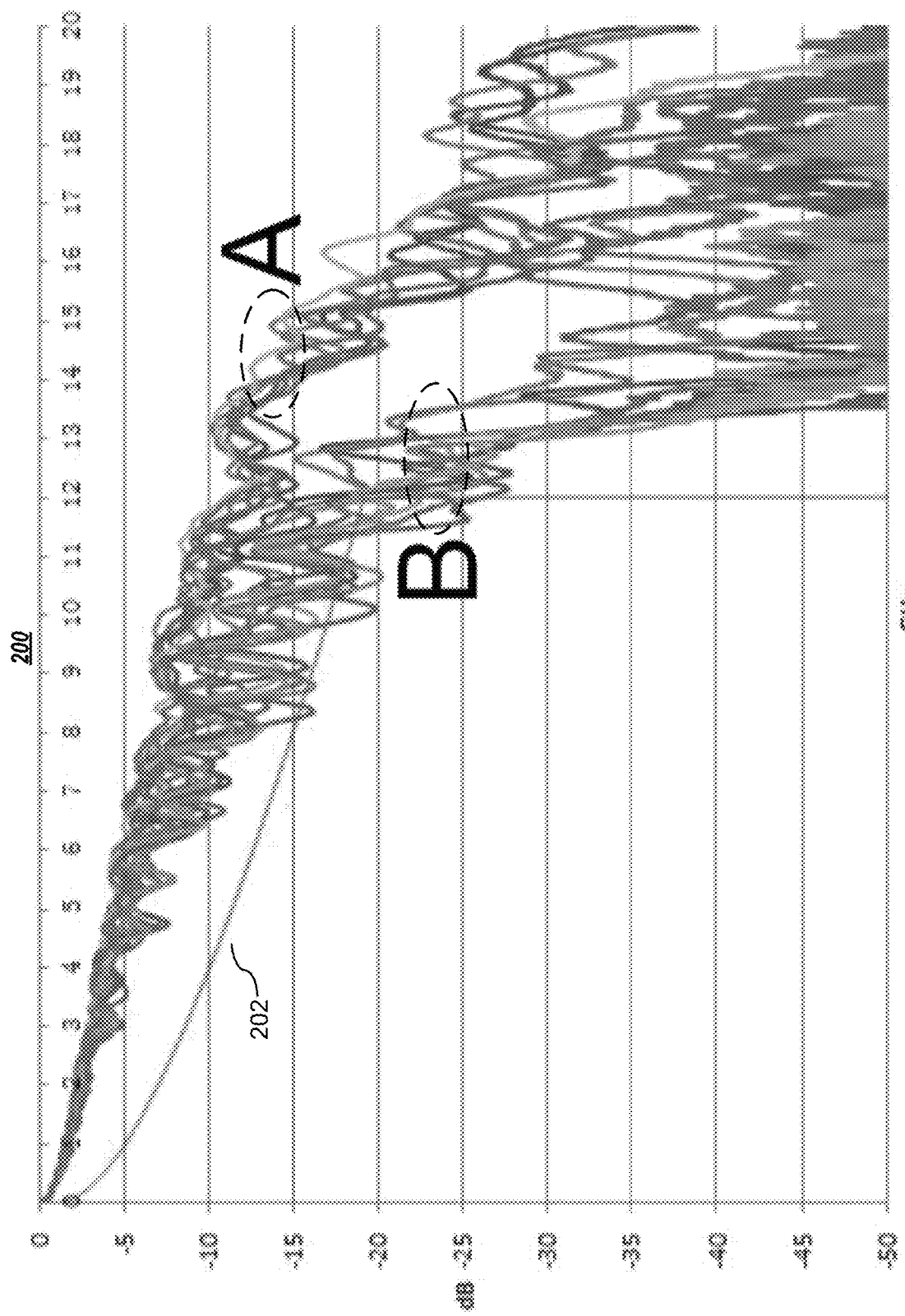
FIG. 2 shows simulated insertion loss results with and without the presence of pad resonance, according to embodiments of the present disclosure.

FIG. 2 shows simulation results for insertion loss from 0-20 GHz with and without the presence of pad resonance, according to embodiments of the present disclosure. The group of plots labeled "A" in FIG. 2 illustrate insertion loss for a number of differential transmit and/or receive paths in a connector port for a signal breakout design that utilizes the metal pad area and pin leg as part of the signal path. Such a design reduces or eliminates unused portions of metal pad area and the pin leg by making them part of the signal path. Conversely, the group of plots labeled "B" show the results for a signal breakout design that leaves exposed portions of metal pad area and the pin leg, such that these portions are not used as part of the signal path. Trace 202 in FIG. 2 delineates a desirable maximum level of insertion loss, here, up to predetermined frequency of 12 GHz, which may be defined according to a proprietary or public (e.g., IEEE) standard.

As trace B in FIG. 2 indicates, the unused portion of the circuit comprising a pad area and the pin leg can create resonances that cause the insertion loss to exceed the desirable maximum level 202, whereas a proper signal breakout design may eliminate such resonance, for example, by shifting the location of unwanted resonances toward higher frequencies in compliance with trace 202. However, restricting a PCB layout to signal breakouts in only one direction increases the number of layers having to breakout signals in a PCB, thereby, increasing the complexity and manufacturing cost associated with such designs, rendering such solutions impractical for real-world applications.

Figure 3:
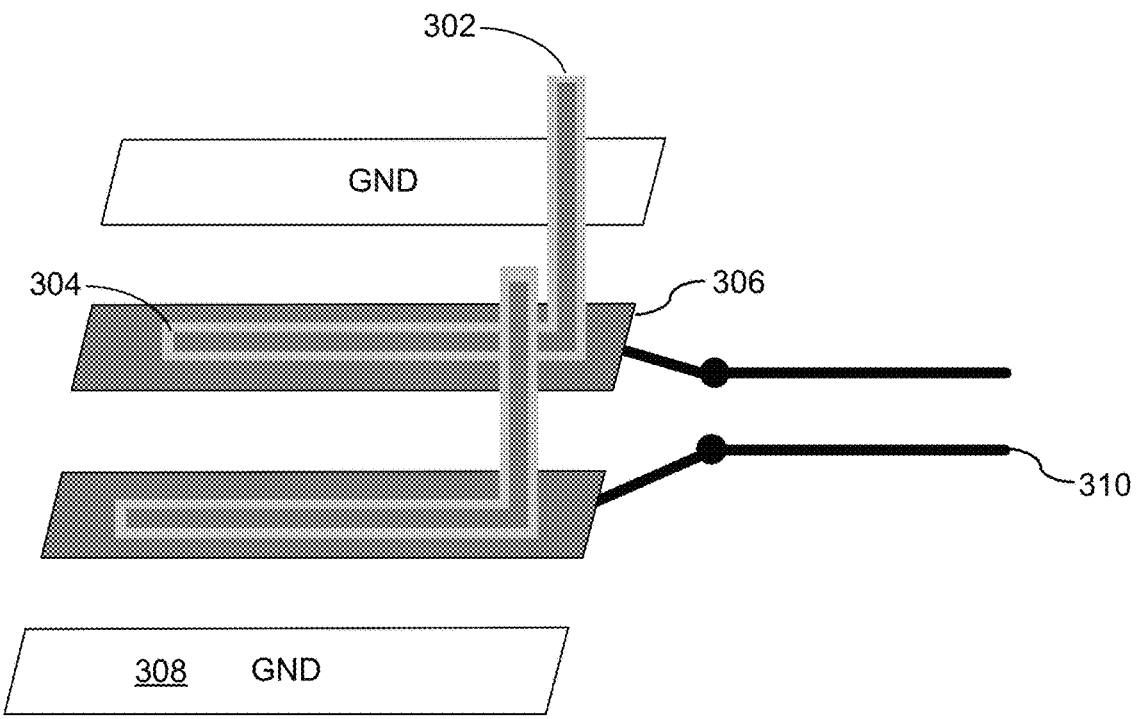
FIG. 3 depicts a simplified schematic illustrating an SMT circuit having low-conductance pads according to embodiments of the present disclosure.

FIG. 3 depicts a simplified schematic illustrating an SMT circuit having low-conductance pads according to embodiments of the present disclosure. Similar to the SMT circuit in FIG. 1, connector pin 302 and pin leg 304 in SMT circuit 300 are part of a lead frame. SMT circuit 300 comprises connector pad 306, ground strip 308, and a portion of signal path 310 that includes connector pin 302. Circuit components 302-308 may be formed of electrically conductive material and mounted on non-conductive PCB material (not shown).

It is noted that circuit 300 may be implemented as a microstrip design. However, this is not intended as a limitation on the scope of the present disclosure, since the teachings herein may equally apply to other designs, including free-standing electrical components, e.g., at lower frequencies than those discussed herein.

In embodiments, connector pad 306 and pin leg 304 of the lead frame may be made lossy to have lower conductivity at high frequencies. As a person of skill in the art will appreciate, high frequencies are known to push the majority of the current to a relatively thin layer near the outer surface of a conductor due to the so-called skin-effect. In embodiments, the lossy components reduce the amount of current flowing through the unused portion of circuit 300, i.e., pin leg 304 and unused portions of and pad 306, thereby, reducing insertion loss.

In embodiments, this may be accomplished by constructing the portion of the lead frame that comprise connector pad 306 and pin leg 304 from a low-conductivity material, e.g., metals such as tin, zinc, or lead, which have conductivities in the 1e6 to 1e5 S/m range, resulting in higher electrical losses than if pad 306 and/or pin leg 304 were made of copper having a conductivity of 5.96e7 S/m.

In embodiments, connector pad 306 and pin leg 304 of the lead frame may be coated with an alloy that may comprise any number of metals having conductivities up to an order of magnitude or more lower than copper. In embodiments, a rough solder mask may be used to accomplish the desired lowered conductivity. As a person of skill in the art will appreciate, several other ways to increase loss in pad 306 may be employed to reduce current flow through pad 306 to damp any number of resonances to acceptable levels. In embodiments, ground strip 308 may also be made of low-conductivity material, plated with a metal or alloy, or subjected to a rough solder mask to further damp pad resonance.

Since the length of connector pad 306 is typically 50 to 100 mils, compared to the 15 to 25 inches the length of most high-speed channels, the overall length of connector pad 306 is only about $\frac{1}{200}^{th}$ of the overall channel length. In embodiments, by making some or all of the lead frame from lossy material, the overall increase in the total end to end loss budget of the channel caused by the $\frac{1}{200}^{th}$ or less length may be negligible; especially, when compared to the benefits. Such benefits comprise maintaining mechanical stability by maintaining pad dimensions, and high signal integrity that goes hand-in-hand with decreasing return loss, insertion loss, and crosstalk, and damping unwanted resonances according to various embodiments of the present disclosure.

Figure 4:
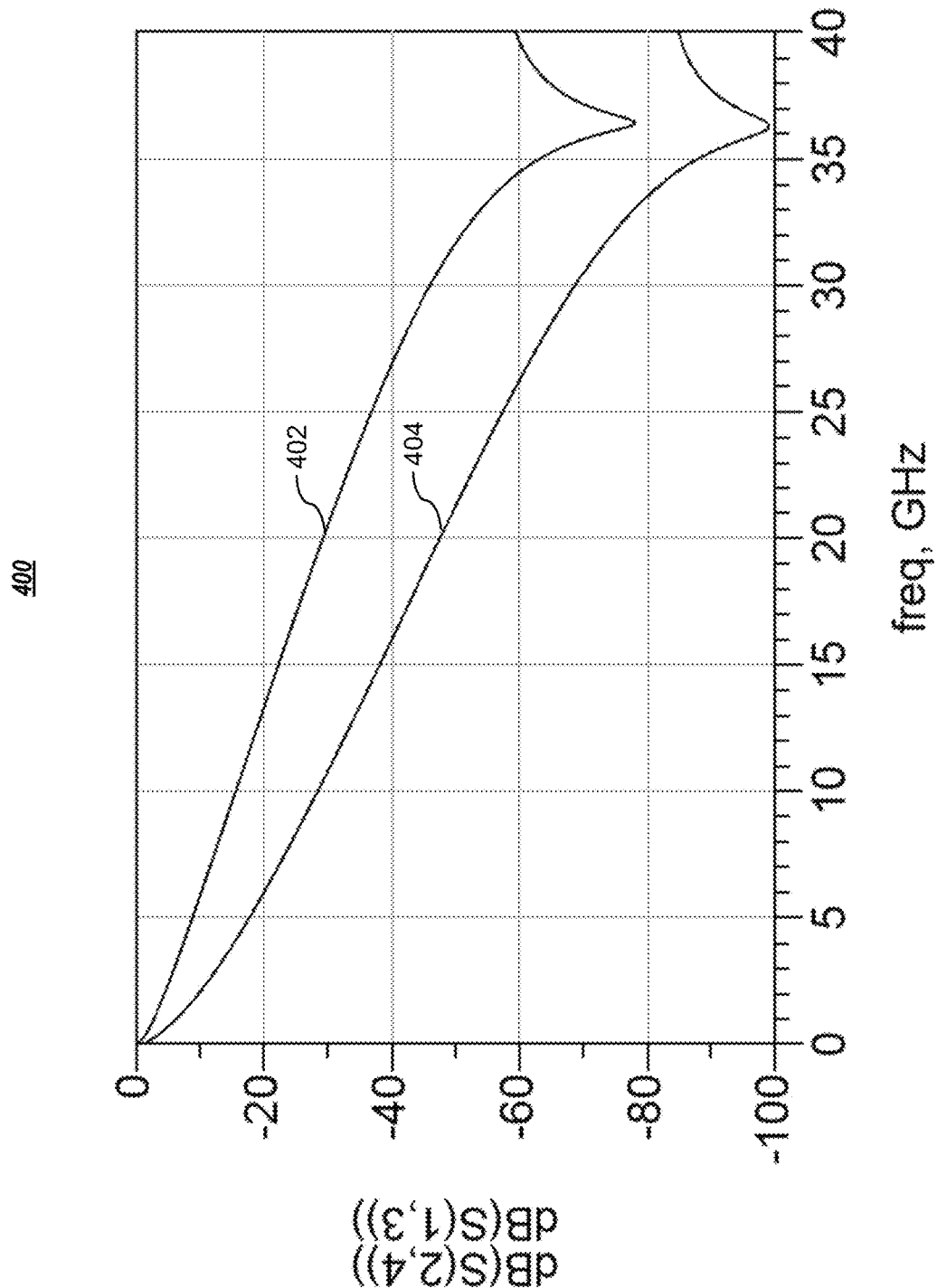
FIG. 4 shows insertion loss results for a circuit simulation with and without low-conductance pads according to embodiments of the present disclosure.

FIG. 4 shows insertion loss results for a circuit simulation with and without low-conductance pads according to embodiments of the present disclosure. The circuit may be used, for example, for 28 GB/sec non-return-to-zero (NRZ) signaling. As FIG. 4 illustrates, the circuit exhibits a resonance at a frequency of 36.3 GHz, which is reasonably far away from the frequency of interest, here, 14 GHz. Plot 402 indicates insertion loss for scenarios when plating is applied according to various embodiments presented herein. As can be seen, under such conditions, the insertion loss at the frequency of interest may be −20.98 dB. In contrast, plot 404 shows insertion loss results when no plating is applied, as is the case in traditional designs. As can be seen, the insertion loss at the frequency of interest under such condition is −36.24 dB. These results demonstrate that by using low-conductance plating or low-conductance pads insertion loss may be reduced by 15.25 dB.

It is understood that, instead of constructing pads and other parts of the unused circuit entirely from low-conductance material, various embodiments may take advantage of the skin-effect and coat conductive surfaces with less conductive material, such that only a portion of a conductor, i.e, the portion that ultimately carries most of the current at high operating frequencies, is lossy.

FIG. 5 is a flowchart illustrating a process for improving signal integrity, according to embodiments of the present disclosure. In embodiments, process (500) for improving signal integrity may begin by applying (505) a voltage to a signal path that comprises a connector pin, such as the connector pin in one embodiment illustrated in FIG. 3. The connector pin may have a first conductivity and be coupled to a connector pin leg that is disposed on a conductive pad having a second conductivity that is lower than the first conductivity. The connector pin leg and at least a portion of the pad may form a resonant circuit, e.g., together with a ground connection that may be capacitively coupled to at least the connector pin leg. The resonant circuit may be the cause of transmission line effects at one or more frequencies and may, thus, cause a signal to be reflected into the signal path. Such reflections are caused by that impedance discontinuity that results from the signal path having a different impedance than the resonant circuit.

The voltage drives (510) a current through the connector pin. In embodiments, the lower second conductivity causes a reduction in insertion loss in the signal path by damping a current in the resonant circuit, e.g., proportional to a ratio between the second conductivity and the first conductivity. It is understood that the second conductivity may be made lower than the first conductivity by any of the methods previously mentioned, e.g., the methods discussed with reference to FIG. 3.

It shall be noted that: (1) certain steps may optionally be performed; (2) steps may not be limited to the specific order set forth herein; (3) certain steps may be performed in different orders; and (4) certain steps may be done concurrently.

One skilled in the art will recognize no computing system or programming language is critical to the practice of the present disclosure. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A high-speed transmission circuit comprising:
   a connector pin that serves as part of a signal path, the connector pin having a first conductivity;
   a connector pin leg coupled to the connector pin and having the first conductivity; and
   a pad coupled to the connector pin leg and comprising a second conductivity that is lower than the first conductivity, the connector pin leg and at least a portion of the pad forming a resonant sub-circuit that is coupled to the signal path, the second conductivity causing a reduction in insertion loss in the signal path, when compared to an insertion loss in the signal path if the pad had only the first conductivity, by damping a current in the resonant sub-circuit.

2. The high-speed transmission circuit of claim 1, wherein the resonant sub-circuit causes a transmission line effect at one or more frequencies, the resonant sub-circuit being coupled to a ground connection that is capacitively coupled to at least the connector pin leg.

3. The high-speed transmission circuit of claim 2, wherein the ground connection has a different conductivity than the first conductivity.

4. The high-speed transmission circuit of claim 1, wherein the connector pin is associated with a first impedance at a frequency of interest, and wherein the connector pin leg is associated with a second impedance at the frequency of interest.

5. The high-speed transmission circuit of claim 4, wherein the second impedance represents an impedance discontinuity at the frequency of interest.

6. The high-speed transmission circuit of claim 5, wherein the impedance discontinuity causes a signal at the frequency of interest to be reflected into the signal path.

7. The high-speed transmission circuit of claim 1, wherein the current in the resonant sub-circuit is damped proportional to a ratio between the second conductivity and the first conductivity, the pad having been plated with a material that has the second conductivity.

8. The high-speed transmission circuit of claim 1, wherein the current has one or more high frequency components that flow on an outer layer of the connector pin.

9. A lead frame comprising:
  a connector pin that serves as part of a signal path, the connector pin having a first conductivity; and
  a connector pin leg coupled to the connector pin and to a pad that comprises a second conductivity lower than the first conductivity, the connector pin leg and at least a portion of the pad forming a resonant sub-circuit that is coupled to the signal path, the second conductivity causing a reduction in insertion loss in the signal path, when compared to an insertion loss in the signal path if the pad had only the first conductivity, by damping a current in the resonant sub-circuit.

10. The lead frame of claim 9, wherein the resonant sub-circuit causes a transmission line effect at one or more frequencies.

11. The lead frame of claim 9, wherein the connector pin is associated with a first impedance at a frequency of interest, and wherein the connector pin leg is associated with a second impedance at the frequency of interest.

12. The lead frame of claim 11, wherein the second impedance represents an impedance discontinuity at the frequency of interest.

13. The lead frame of claim 12, wherein the impedance discontinuity causes a signal at the frequency of interest to be reflected into the signal path.

14. The lead frame of claim 9, wherein the current in the resonant sub-circuit is damped proportional to a ratio between the second conductivity and the first conductivity.

15. The lead frame of claim 9, wherein the current has one or more high frequency components that flow on an outer layer of the connector pin.

16. A method for reducing insertion loss in a high-speed transmission circuit, the method comprising:
  applying a voltage to a signal path that comprises a connector pin; and
  driving a current through the connector pin that has a first conductivity and a connector pin leg coupled to a pad, the pad comprising a second conductivity that is lower than the first conductivity and causing a reduction in insertion loss in the signal path, when compared to an insertion loss in the signal path if the pad had only the first conductivity, by damping a current in a resonant sub-circuit that is formed by the connector pin leg and at least a portion of the pad.

17. The method of claim 16, wherein the resonant sub-circuit causes a transmission line effect at one or more frequencies, the resonant sub-circuit being coupled to a ground connection that is capacitively coupled to at least the connector pin leg, the ground connection having a different conductivity than the first conductivity.

18. The method of claim 16, wherein the connector pin is associated with a first impedance at a frequency of interest, and wherein the connector pin leg is associated with a second impedance at the frequency of interest.

19. The method of claim 18, wherein, at the frequency of interest, the second impedance represents an impedance discontinuity that causes a signal to be reflected into the signal path.

20. The method of claim 19, wherein the current in the resonant sub-circuit is damped proportional to a ratio between the second conductivity and the first conductivity, the pad having been plated with a material that has the second conductivity.

* * * * *